United States Patent [19]

Ono et al.

[11] Patent Number: 5,448,101
[45] Date of Patent: Sep. 5, 1995

[54] SEMICONDUCTOR DEVICE HAVING P CHANNEL HIGH VOLTAGE TRANSISTORS WITH IMPROVED BREAKDOWN VOLTAGES

[75] Inventors: Atsushi Ono; Nobuyuki Saiki, both of Hyogo, Japan

[73] Assignee: Mitsubishi Denki Kabushiki Kaisha, Tokyo, Japan

[21] Appl. No.: 272,445

[22] Filed: Jul. 8, 1994

Related U.S. Application Data

[63] Continuation of Ser. No. 59,938, May 13, 1993, abandoned.

[30] Foreign Application Priority Data

Jun. 26, 1992 [JP] Japan ................................. 4-169449

[51] Int. Cl.[6] ....................... H01L 29/06; H01L 27/04
[52] U.S. Cl. ..................................... 257/491; 257/509; 257/345
[58] Field of Search ................ 257/339, 341, 345, 401, 257/491–495, 500–505, 344, 345, 509

[56] References Cited

U.S. PATENT DOCUMENTS

4,965,221 10/1990 Dennison et al. .................... 257/506
5,164,806 11/1992 Nagatomo et al. .................. 257/409

FOREIGN PATENT DOCUMENTS

0151363 11/1980 Japan ..................................... 257/345

Primary Examiner—Robert P. Limanek
Assistant Examiner—Alexander Oscar Williams
Attorney, Agent, or Firm—Lowe, Price, LeBlanc & Becker

[57] ABSTRACT

The present invention is primarily directed to obtaining a P channel high voltage transistor with an improved breakdown voltage. A first N type well region is provided in a main surface of a P type semiconductor substrate. A first field oxide film is provided in the main surface of the first N type well region. A P type source region and a P type drain region are provided on the opposite sides of the first field oxide film in the main surface of the first N type well region. A P type impurity injection region is provided immediately under the field oxide film so as to be connected to the P type drain region. A gate electrode is provided between the P type source region and the P type drain region on the first N type well region. An N+ ion injection region is provided between the P type source region and a channel in the N type well region. The first N type well region located under the P type drain region has its N type impurity concentration uniform at any depth.

3 Claims, 3 Drawing Sheets

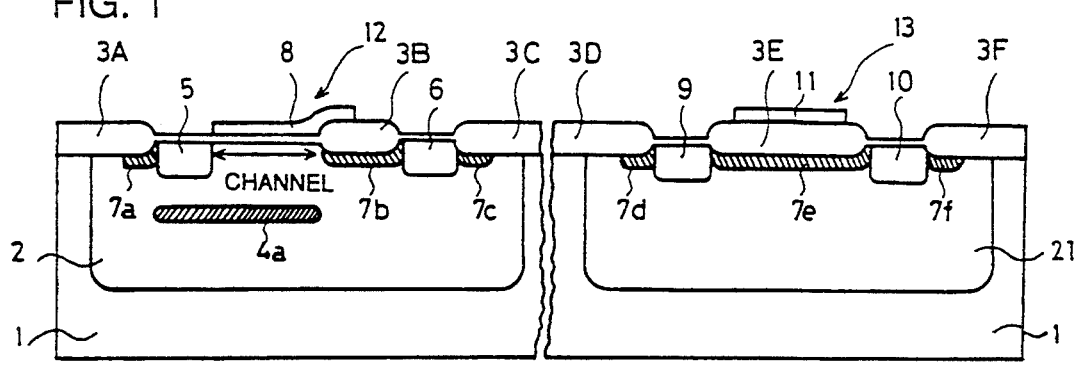
FIG. 1
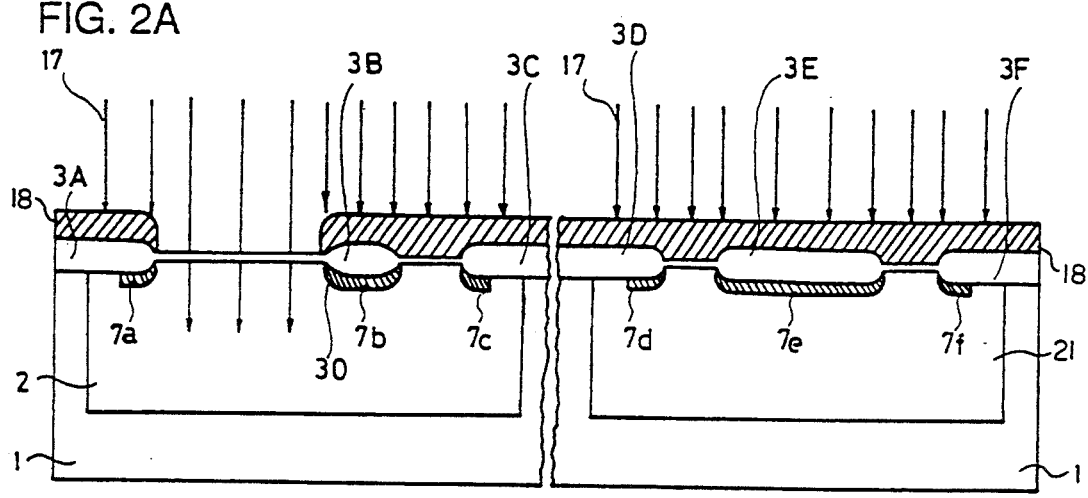
FIG. 2A
FIG. 2B
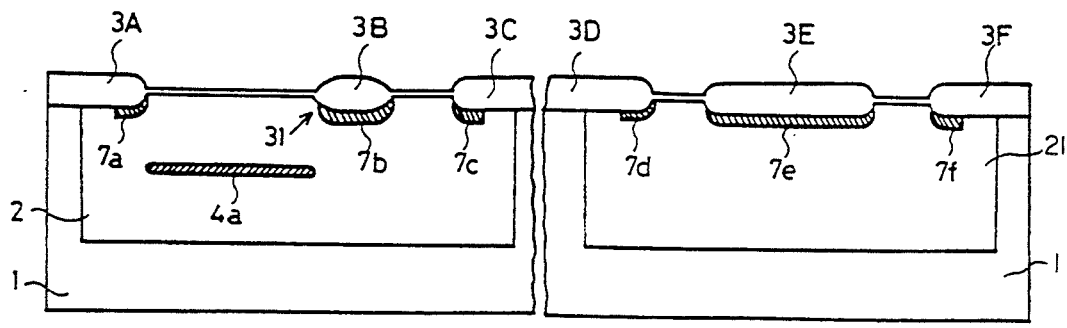

SEMICONDUCTOR DEVICE HAVING P CHANNEL HIGH VOLTAGE TRANSISTORS WITH IMPROVED BREAKDOWN VOLTAGES

This application is a continuation of application Ser. No. 08/059,938 filed May 13, 1993 and now abandoned.

BACKGROUND OF THE INVENTION

1. Field of the Invention

The present invention generally relates to semiconductor devices, and more particularly, P channel high voltage transistors with improved breakdown voltages. The present invention further relates to a method of manufacturing such a semiconductor device.

2. Description of the Background Art

FIG. 4 is a sectional view showing a conventional semiconductor device including a P channel high voltage transistor, and a pulldown resistor provided between the P channel high voltage transistor and a $V_{EE}$ terminal. Such a P channel high voltage transistor is used, for example, in a switch of a fluorescent character display tube.

A first N type well region 2 and a second N type well region 21 are provided on the main surface of a P type semiconductor substrate 1. Field oxide films 3A, 3B and 3C are provided on the main surface of first N type well region 2. A P type source region 5 and a P type drain region 6 are formed spaced apart from each other on the opposite sides of field oxide film 3B on the main surface of first N type well region 2. A P type impurity injection region 7b having an impurity concentration lower than that of P type drain region 6 is provided immediately under field oxide film 3B so as to be connected P type drain region 6. P type source region 5 and P type impurity injection region 7b are formed to be spaced apart from each other so as to form a channel region. Also provided immediately under field oxide film 3A is a P type impurity injection region 7a having an impurity concentration lower than that of P type source region 5 so as to be connected to P type source region 5. Also provided immediately under field oxide film 3C is a P type impurity injection region 7c having an impurity concentration lower than that of the P type drain region so as to be connected to P type drain region 6.

A gate electrode 8 is provided between P type source region 5 and P type drain region 6 on first N type well region 2, with a thin oxide film provided therebetween. Gate electrode 8 is provided such that a part of the electrode overlaps field oxide film 3B.

An N+ ion injection region 4a having a concentration higher than an N type impurity concentration of N type well region 2 is provided under P type source region 5 and the channel in N type well region 2. An N+ ion injection region 4b having a concentration higher than the N type impurity concentration of the N type well is provided under P type drain region 6 in N type well region 2.

Field oxide films 3D, 3E and 3F are provided in the main surface of second N type well region 21. An output side P+ region 9 and a $V_{EE}$ power source side P+ region 10 are provided at the opposite sides of field oxide film 3E in the main surface of second N type well region 21. A P type impurity resistive layer 7e having a concentration lower than the P type impurity concentration of P+ regions 9 and 10 is provided immediately under field oxide film 3E in order to connect output side P+ region 9 and $V_{EE}$ power source side P+ region 10.

Also provided immediately under field oxide film 3D is a P type impurity injection region 7d connected to output side P+ region 9. Provided also under field oxide film 3F is a P type impurity injection region 7f connected to $V_{EE}$ power source side P+ region 10 and having a concentration lower than the P type impurity concentration of $V_{EE}$ power source side P+ region 10. Provided on field oxide film 3E is an electrode 11 formed of polysilicon. A voltage of the same volume as that to be applied to P type impurity resistive layer 7e is applied to electrode 11, thereby preventing damage of P type impurity resistive layer 7e. Electrode 11 is provided for serving such a function. N+ ion injection regions 4c and 4d having a concentration higher than the N type impurity concentration of second N type well 21 are provided under output side P+ region 9 and $V_{EE}$ power source side P+ region 10 in second N type well region 21.

FIG. 5 is a circuit diagram showing the above-described P channel high voltage transistor, and a pulldown resistor between the P channel high voltage transistor and the $V_{EE}$ terminal. In the figure, reference numeral 12 denotes the P channel high voltage transistor, reference numeral 13 denotes the pulldown resistor, 14 denotes an output terminal, 15 denotes a $V_{EE}$ power source terminal and 16 denotes a power source terminal. Power source terminal 16 is supplied with a power source voltage vcc. Such a switch is used as a switch for a fluorescent character display tube as described above. An application of the power source voltage Vcc of 5 V and an appropriate voltage to gate electrode 8 turns on P channel high voltage transistor 12, thereby turning on the fluorescent character display tube. Then, upon application of a high voltage (−35 V) to output terminal 14 and $V_{EE}$ power source terminal 15, the voltage on output terminal 14 is drawn by pulldown resistor 13 to turn off the fluorescent character display tube.

In thus structured semiconductor memory device, a high voltage applied to a part between output terminal 14 and $V_{EE}$ power source terminal 15 results in an application of a high voltage to P+ drain region 6 of P channel high voltage transistor 12, output side P+ region 9 and $V_{EE}$ power source side P+ region 10 of pulldown resistor 13. However, because of N+ ion injection region 4a and P type impurity injection region 7b, breakdown hardly occurs between a portion deep in the channel and a channel N edge on the side of P+ drain region 6.

A conventional method of forming N+ ion injection region 4a of the P region high voltage transistor shown in FIG. 4 will be described in the following.

With reference to FIGS. 6A and 6B, N+ ion injection region 4a is conventionally formed by injecting N type impurities in the main surface of P type semiconductor substrate 1. No N+ ion injection region is formed under field oxide films 3A, 3B, 3C, 3D, 3E and 3F because a thickness of these films is too large to pass N type impurities. N+ ion injection regions 4a, 4b, 4c and 4d are formed under an oxide film of a small thickness.

The conventional method of forming an N+ ion injection region is conducted in a manner as described above and has the following problems.

With reference to FIG. 6B, N+ ion injection regions 4b, 4c and 4d are formed at undesired parts simultaneously with a formation of N+ ion injection region 4a.

In addition, a bird's beak 30 of field oxide film 3B is so small in thickness that N type impurities 17 pass therethrough to be injected in an edge portion 31 of P type impurity injection region 7b. As a result, the P type impurity and the N type impurities cancel with each other to result in elimination of P type impurity injection region 7b at a portion 32 under bird's beak 30 as shown in FIG. 6B.

The foregoing problems have such adverse effects on an obtained semiconductor device.

With reference to FIG. 4, since N+ ion injection region 4b is provided deep in second N type well region 21 under P+ drain region 6, a breakdown voltage between P+ drain region 6 and semiconductor substrate 1 is reduced for a reason unknown.

In addition, also on the side of the pulldown resistor 13, since N+ ion injection region 4c is provided under output side P+ region 9, a breakdown voltage between output side P+ region 9 and substrate 1 is reduced for a reason unknown. Similarly, with N+ ion injection region 4d under $V_{EE}$ power source side P+ region 10, a breakdown voltage between $V_{EE}$ power source side P+ region 10 and substrate 1 is reduced for a reason unknown.

Furthermore, with reference to FIG. 6B, the portion 32 from which the edge portion of P type impurity injection region 7b is eliminated, an electric field is intensified to cause breakdown to prevent the breakdown voltage from being maintained.

SUMMARY OF THE INVENTION

The present invention is directed to solving the above-described problems and its object is to provide a semiconductor device improved so as to maintain a breakdown voltage of a P channel high voltage transistor.

Another object of the present invention is to provide a semiconductor device improved so as to maintain a breakdown voltage in a P channel high voltage transistor and a pulldown resistor.

A further object of the present invention is to provide a method of manufacturing such a semiconductor device as described above.

A semiconductor device according to one aspect of the present invention includes a P type semiconductor substrate. A first N type well region is provided on the main surface of the P type semiconductor substrate. A first field oxide film is provided on the main surface of the first N type well region. A P type source region and a P type drain region are provided spaced apart from each on the opposite sides of the first field oxide film in the main surface of the first N type well region. A P type impurity injection region having an impurity concentration lower than that of the P type drain region is provided immediately under the first field oxide film so as to be connected to the P type drain region. A gate electrode is provided between the P type source region and the P type drain region on the first N type well region. An N+ ion injection region having an impurity concentration higher than that of the N type well region forming the N type well is provided under the P type source region and a channel. The first N type well region located under the P type drain region has its N type impurity concentration uniform at any depth.

A semiconductor device according to another aspect of the present invention further includes a second N type well region provided in the main surface of the P type semiconductor substrate so as to be spaced apart from the first N type well region. A second field oxide film is provided in the main surface of the second N type well region. An output side P+ region and a $V_{EE}$ power source side P+ region are provided spaced apart from each other on the opposite sides of the second field oxide film in the main surface of the second N type well region. A P type impurity resistive layer for connecting the output side P+ region and the $V_{EE}$ power source side P+ region and having an impurity concentration lower than that of these P+ regions is provided immediately under the second field oxide film. An electrode is provided on the second field oxide film. The second N type well region located under the output side P+ region and the $V_{EE}$ power source side P+ region has its N type impurity concentration uniform at any depth.

A manufacturing method according to a further aspect of the present invention is directed to a method of manufacturing a semiconductor device having a P type source region and a P type drain region provided on the opposite sides of a field oxide film. An N type well region is formed on the main surface of a P type semiconductor substrate. A field oxide film is formed on the main surface of the N type well region. With a portion other than a part wherein the P type source region is to be formed used as a mask, N type impurities of a concentration higher than that of the N type impurities forming the N type well region are injected in the main surface of the P type semiconductor substrate, thereby forming an N+ ion injection region at a position under the P type source region to be formed and apart from the main surface of the N type well region. The P type source region and the P type drain region are formed spaced apart from each other on the opposite sides of the field oxide film in the main surface of the N type well region. A gate electrode is formed between the P type source region and the P type drain region on the N type well region.

In the semiconductor device according to said one aspect of the present invention, the first N type well region located under the P type drain region has its N type impurity concentration uniform at any depth, so that a breakdown voltage between the P type drain region and the substrate is increased to improve a breakdown voltage of the P channel high voltage transistor.

In the semiconductor device according to said another aspect of the present invention, in addition to the above-described feature, the second N type well region located under the output side P+ region and the $V_{EE}$ power source side P+ region has its N type impurity concentration uniform at any depth, so that a breakdown voltage between the output side P+ region and the substrate and a breakdown voltage between the $V_{EE}$ power source side P+ region and the substrate are increased to improve breakdown voltages of the P channel high voltage transistor and the pulldown resistor.

In accordance with the manufacturing method according to said further aspect of the present invention, N type impurities of a concentration higher than the N type impurity concentration forming the N type well region are injected in the main surface of the P type semiconductor substrate by using a part other than a portion wherein the P type source region is formed as a mask, thereby forming the N+ ion injection region at a position under the P type source region to be formed and apart from the main surface of the N type well region, so that no N+ ion injection region is formed under the P type drain region, the output side P+ region and the $V_{EE}$ power source side P+ region.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view of a semiconductor device including a P channel high voltage transistor and a pulldown resistor according to one embodiment of the present invention.

FIGS. 2A and 2B are sectional views of the semiconductor device shown in FIG. 1 at respective steps of a main part of a first manufacturing method.

DESCRIPTION OF THE PREFERRED EMBODIMENTS

Figure 3A:
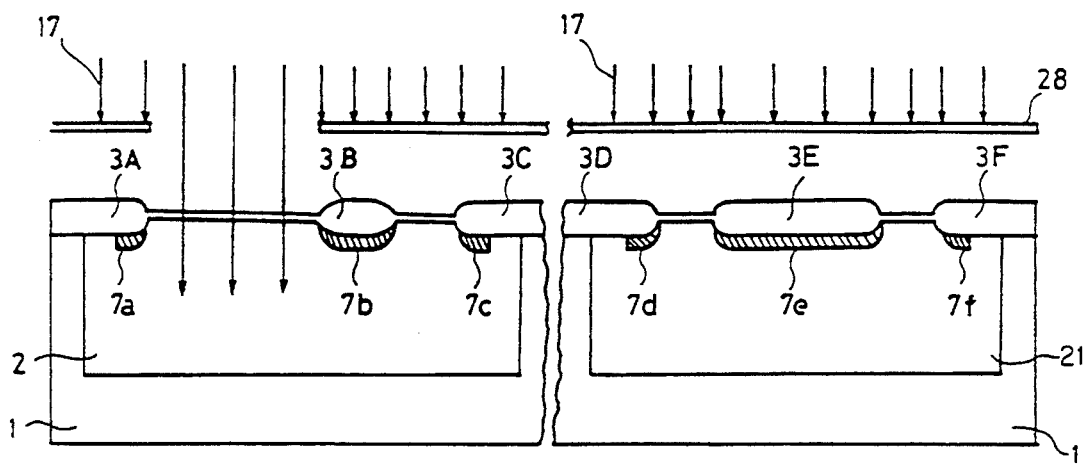
FIGS. 3A and 3B are sectional views of the semiconductor device shown in FIG. 1 at respective steps of a main part of a second manufacturing method.

An embodiment of the present invention will be described in the following with reference to the drawings.

FIG. 1 is a sectional view showing a semiconductor device including a P channel high voltage transistor and a pulldown resistor according to one embodiment of the present invention. A first N type well region 2 and a second N type well region 21 are provided on a main surface of a P type semiconductor substrate 1.

Field oxide films 3A, 3B and 3C are provided on the main surface of first N type well region 2. A P type source region 5 and a P type drain region 6 are provided at opposite sides of field oxide film 3B in the main surface of first N type well region 2. A P type impurity injection region 7b having a concentration lower than the impurity concentration of P type drain region 6 is provided immediately under field oxide film 3B so as to be connected to P type drain region 6. P type source region 5 and P type impurity injection region 7b are formed spaced apart from each other to form a channel region. A gate electrode 8 is provided on the channel region between P type source region 5 and P type drain region 6 on first N type well region 2. A part of gate electrode 8 overlaps field oxide film 3B. An N+ ion injection region 4a having a concentration higher than the N type impurity concentration forming the N type well is provided under P type source region 5 and the channel in N type well region 2. First N type well region 2 located under P type drain region 6 has its N type impurity concentration uniform at any depth.

Second N type well region 21 is provided spaced apart from first N type well region 2 in the main surface of P type semiconductor substrate 1. Second field oxide films 3D, 3E and 3F are provided in the main surface of second N type well region 21. An output side P+ region 9 and a $V_{EE}$ power source side P+ region 10 are provided spaced apart from each other at the opposite sides of field oxide film 3E in the main surface of second N type well region 21. A P type impurity resistive layer 7e for connecting output side P+ region 9 and $V_{EE}$ power source side P+ region 10 and having a concentration lower than the P type impurity concentration forming these P+ regions 9 and 10 is provided immediately under field oxide film 3E. An electrode 11 is provided on field oxide film 3E. Second N type well region 21 located under output side P+ region 9 and $V_{EE}$ source side P+ region 10 has its N type impurity concentration uniform at any depth. A circuit diagram of thus structured semiconductor device is the same as that shown in FIG. 5.

Operation will be described in the following.

Figure 5:
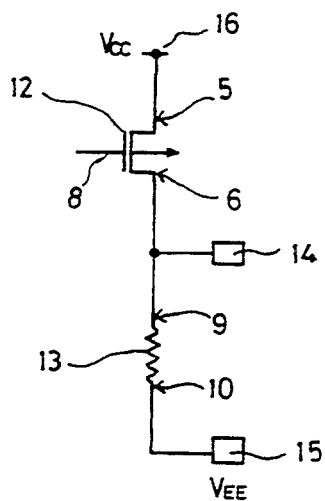
FIG. 5 is a circuit diagram of a semiconductor device including a P channel high voltage transistor and a pull-down resistor.
Figure 6A:
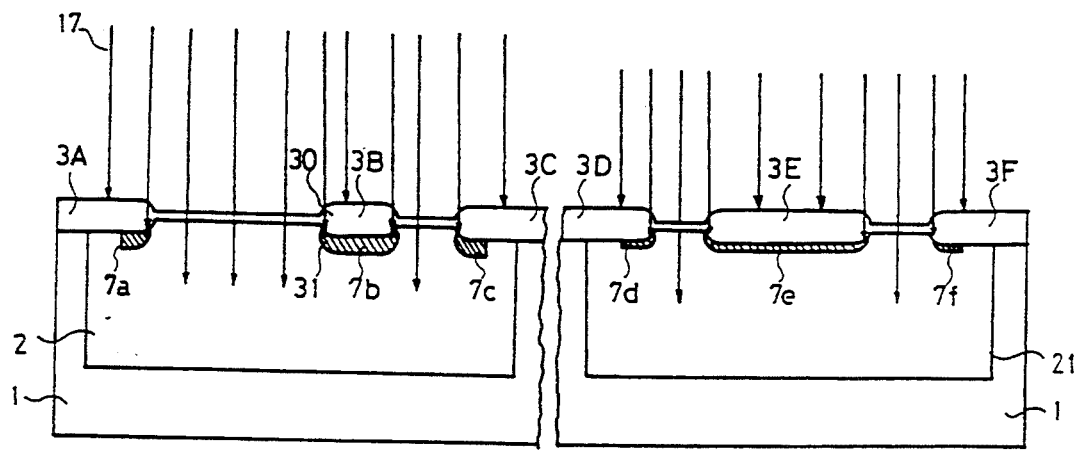
FIGS. 6A and 6B are sectional views of the conventional semiconductor device including a P channel high voltage transistor and a pulldown resistor at respective steps of a main part of a manufacturing method.
Figure 6B:
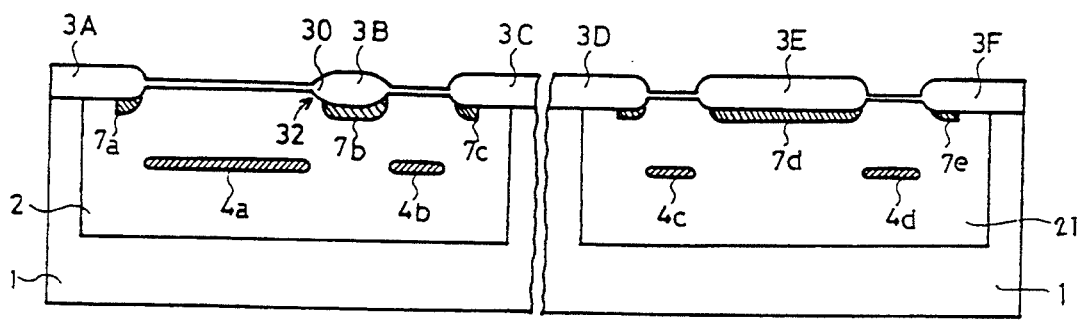

With reference to FIGS. 1 and 5, a high voltage is applied to P type drain region 6 of P channel high voltage transistor 12 by an application of a high voltage to output terminal 14. Since in the device of the present embodiment, first N type well region 2 located under P type drain region 6 has its N type impurity concentration uniform at any depth, breakdown between P type drain region 6 and substrate 1 is unlikely to occur, which improves a breakdown voltage between P type drain region 6 and substrate 1. A breakdown voltage of P type high voltage transistor 12 is improved accordingly.

In addition, an application of a high voltage to output terminal 14 and $V_{EE}$ power source terminal 15 results in an application of a high voltage to output side P+ region 9 and $V_{EE}$ power source side P+ region 10. In the device according to the present embodiment wherein second N type well region 21 located under output side P+ region 9 and $V_{EE}$ power source side P+ region 10 has its N type impurity concentration uniform at any depth, breakdown is unlikely to occur between output side P+ region 9 and substrate 1 and between $V_{EE}$ power source side P+ region 10 and substrate 1 even with a high voltage applied to output side P+ region 9 and $V_{EE}$ power source side P+ region 10, whereby breakdown is unlikely occur. As a result, a breakdown voltage of pulldown resistor 13 is improved.

A method of forming N+ ion injection region 4a as shown in FIG. 1 will be described in the following.

With reference to FIGS. 2A and 2B, a resist 18 is formed at a part other than the portion surrounded by field oxide films 3A and 3B. Resist 18 is formed to also cover the part of bird's beak 30 of field oxide film 3B. With resist 18 used as a mask, N type impurities 17 are injected in the main surface of semiconductor substrate 1, thereby forming N+ ion injection region 4a at a position under a P type source region to be formed and the channel and apart from the main surface of N type well region 2.

According to this method, no N+ ion injection region is formed at a part located under the P type drain region, a part located under output side P+ region 9 and a part located under $V_{EE}$ power source side P+ region 10, with reference to FIGS. 1 and 2B. Therefore, P channel high voltage transistor 12 with an improved breakdown voltage and pulldown resistor 13 with an improved breakdown voltage can be obtained. With resist 18 covering the upper part of bird's beak 30, no N type impurity is injected in edge portion 31 of P type impurity ion injection region 7b. As a result, the edge portion of P type impurity injection region 7b is not eliminated. Therefore, an electric field intensity near the channel of P type impurity injection region 7b is efficiently reduced because of P type impurity ion injection region 7b to cause breakdown to be unlikely occur, which improves a breakdown voltage.

Figure 3B:
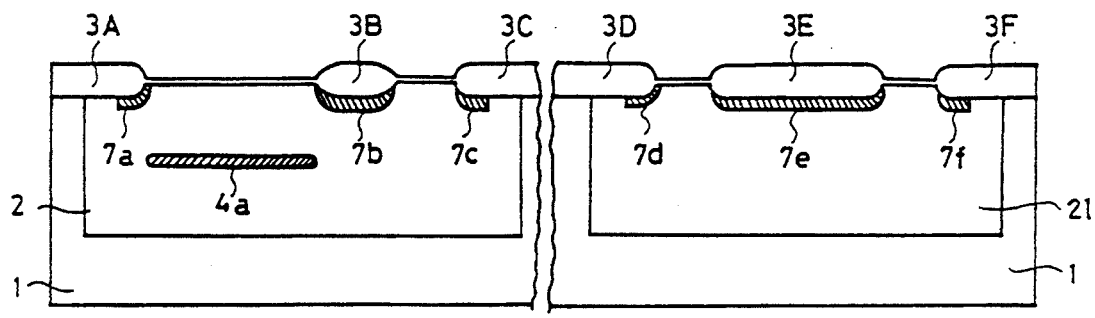
Figure 4:
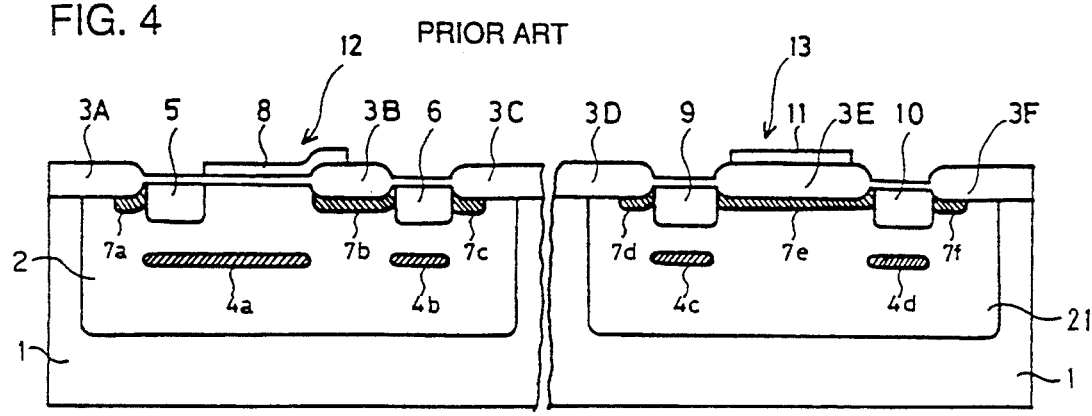
FIG. 4 is a sectional view of a conventional semiconductor device including a P channel high voltage transistor and a pulldown resistor.

Although the above embodiment is described as employing resist 18 for masking the part other than the portion surrounded by field oxide films 3A and 3B, the present invention is not limited thereto and produces the same effect as that of the present embodiment even by a mask 28 as shown in FIGS. 3A and 3B.

In FIGS. 3A and 3B, the same reference numerals are allotted to the parts corresponding to the members as shown in FIGS. 2A and 2B and no description will be made thereof.

As described in the foregoing, since in the semiconductor device according to said one aspect of the present invention, the first N type well region located under the P type drain region has its N type impurity concentration uniform at any depth, breakdown between the P type drain region and the substrate is unlikely to occur to improve a breakdown voltage therebetween, resulting in an improvement in a breakdown voltage of the P channel high voltage transistor.

According to said another aspect of the present invention, since the semiconductor device is structured such that the second N type well region located under the output side P+ region and the $V_{EE}$ power source side P+ region has its N type impurity concentration uniform at any depth, breakdown voltages between the output side P+ region and the substrate and between the $V_{EE}$ power source side P+ region and the substrate are improved to improve breakdown voltages of the P channel high voltage transistor and the pulldown resistor.

In accordance with the method according to said further aspect of the present invention, no N+ ion injection region is formed at the portions located under the P type drain region, the output side P+ region and the $V_{EE}$ power source side P+ region. As a result, a P channel high voltage transistor with an improved breakdown voltage can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A P channel high voltage transistor including:
   a P type semiconductor substrate,
   a first N type well region provided in the main surface of said P type semiconductor substrate,
   a first field oxide film provided in the main surface of said first N type well region,
   a P type source region and a P type drain region provided spaced apart from each other at the opposite sides of said first field oxide film in the main surface of said first N type well region,
   a P type impurity injection region provided immediately under said first field oxide film so as to be connected to said P type drain region and have a concentration lower than the impurity concentration of the P type drain region,
   a gate electrode provided between said P type source region and said P type drain region on said first N type well region, and
   an N+ ion injection region provided in said N type well region under and separated from said P type source region and having a concentration higher than that of the N type impurities forming the N type well region, there being no N+ ion injection region provided in said N type well region directly under said P type drain region at any depth.

2. The transistor according to claim 1, further including:
   a second N type well region provided spaced apart from said first N type well region in the main surface of said P type semiconductor substrate,
   a second field oxide film provided in the main surface of said second N type well region,
   an output side P+ region and a $V_{EE}$ power source side P+ region provided spaced from each other on the opposite sides of said second field oxide film in the main surface of said second N type well region,
   a P type impurity resistive layer provided immediately under said second field oxide film so as to connect said output side P+ region and said $V_{EE}$ power source side P+ region and having a concentration lower than that of the P type impurities forming these P+ regions, and
   an electrode provided on said second field oxide film, said second N type well region located under said output side P+ region and said $V_{EE}$ power source side P+ region having its N type impurity concentration uniform at any depth.

3. The transistor according to claim 1, wherein said P type impurity injection region extends to a part immediately under bird's beak formation on said P type source region side of said field oxide film.

* * * * *